United States Patent
Sekiguchi et al.

(10) Patent No.: US 8,390,123 B2
(45) Date of Patent: Mar. 5, 2013

(54) ULSI MICRO-INTERCONNECT MEMBER HAVING RUTHENIUM ELECTROPLATING LAYER ON BARRIER LAYER

(75) Inventors: Junnosuke Sekiguchi, Kitaibaraki (JP); Toru Imori, Kitaibaraki (JP); Takashi Kinase, Takatsuki (JP)

(73) Assignee: Nippon Mining & Metals Co., Ltd., Minato-ku, Tokyo (JP)

( * ) Notice: Subject to any disclaimer, the term of this patent is extended or adjusted under 35 U.S.C. 154(b) by 364 days.

(21) Appl. No.: 12/735,187

(22) PCT Filed: Jan. 8, 2009

(86) PCT No.: PCT/JP2009/050112
§ 371 (c)(1),
(2), (4) Date: Jun. 18, 2010

(87) PCT Pub. No.: WO2009/093483
PCT Pub. Date: Jul. 30, 2009

(65) Prior Publication Data
US 2010/0314766 A1    Dec. 16, 2010

(30) Foreign Application Priority Data
Jan. 23, 2008 (JP) ................................. 2008-012522

(51) Int. Cl.
*H01L 23/48* (2006.01)
(52) U.S. Cl. ... 257/750; 257/751; 257/752; 257/E23.01; 257/E23.011
(58) Field of Classification Search .......... 257/750–752, 257/E23.01, E23.011; 438/643
See application file for complete search history.

(56) References Cited

U.S. PATENT DOCUMENTS

| | | | |
|---|---|---|---|
| 2005/0009325 A1* | 1/2005 | Chung et al. | 438/637 |
| 2007/0117377 A1 | 5/2007 | Yang et al. | |
| 2008/0213994 A1* | 9/2008 | Chebiam et al. | 438/643 |

FOREIGN PATENT DOCUMENTS

| | | |
|---|---|---|
| JP | 2001-274159 | 10/2001 |
| JP | 2006-294941 | 10/2006 |
| JP | 2007-180313 | 7/2007 |
| JP | 2007-523994 | 8/2007 |
| JP | 2007-311584 | 11/2007 |
| JP | 2008-223100 | 9/2008 |
| TW | 200411921 | 7/2004 |

OTHER PUBLICATIONS

Taiwanese Office Action dated Jun. 7, 2012, including English-language Concise Explanation of Relevance (6 pages).

* cited by examiner

*Primary Examiner* — Zandra Smith
*Assistant Examiner* — Paul Patton
(74) *Attorney, Agent, or Firm* — Flynn, Thiel, Boutell & Tanis, P.C.

(57) ABSTRACT

A ULSI micro-interconnect member having a substrate and a ULSI micro-interconnect formed on the substrate, wherein the ULSI micro-interconnect includes a barrier layer formed on the substrate and a ruthenium electroplating layer formed on the barrier layer; the ULSI micro-interconnect member further including a copper electroplating layer formed using the ruthenium electroplating layer as a seed layer; and a process for fabricating the ULSI micro-interconnect members.

11 Claims, No Drawings

ULSI MICRO-INTERCONNECT MEMBER HAVING RUTHENIUM ELECTROPLATING LAYER ON BARRIER LAYER

TECHNICAL FIELD

The present invention relates to a ULSI micro-interconnect member having, on a ULSI micro-interconnect barrier layer formed on a substrate, a ruthenium layer that has been formed by an electroplating process and is adapted for use as a seed layer, and also relates to a process of forming the same, and a semiconductor wafer on which ULSI micro-interconnects have been formed.

BACKGROUND ART

One known method for forming a copper film for ULSI micro-interconnects (damascene copper interconnects) is a process wherein a seed layer is provided by electroless copper plating, then a film of copper is deposited by copper electroplating.

However, when electroless copper plating is carried out on a mirror surface such as a semiconductor wafer, it has been difficult to obtain a deposited plating film with a sufficient adherence. Moreover, the plating reactivity is low, which has made it difficult to carry out uniform plating over the entire substrate. Up until now, when a copper seed layer has been formed by electroless plating on a barrier metal layer such as tantalum nitride, it has been difficult to uniformly form the plating, as a result of which the adhesion has been insufficient.

The inventors earlier discovered that, by adding, as an additive to an electroless copper plating solution, a water-soluble nitrogen-containing polymer having a small weight-average molecular weight (Mw) and also by either depositing catalyst metal onto a substrate to be plated or initially forming a layer of catalyst metal onto the outermost surface of the substrate prior to immersion in the plating solution and then immersing the substrate in plating solution so as to induce the polymer to be adsorbed onto the catalyst metal through nitrogen atoms, the plating deposition rate is suppressed and the crystals become very small, making it possible to form a uniform thin-film having a film thickness of 15 nm or less on a mirror surface such as a wafer (Patent Document 1). In the examples for the foregoing invention, the inventors have also shown that by initially forming a catalyst metal film onto the outermost surface of the substrate, then immersing the substrate in a plating solution so as to induce the polymer to be adsorbed onto the catalyst metal through nitrogen atoms, the plating deposition rate is suppressed and the crystals become very small, making it possible to form a uniform thin-film having a film thickness of 6 nm or less on a mirror surface such as a wafer.

In such a method, i.e., damascene copper interconnect formation, when a copper seed layer is provided by electroless plating following the formation of a catalyst metal layer, it is essential to form beforehand, and in a separate process from the catalyst metal layer, a barrier layer for preventing copper diffusion. Because this amounts to forming two layers—both a barrier layer and a catalyst metal layer—prior to forming the copper seed layer, such an approach is difficult to apply to an actual production step for ultrafine interconnects in which the film thickness cannot be made large.

Although it is desirable in electronic members for the impurities concentration within films to be made low, the level of organic impurities in films formed by CVD (chemical vapor deposition), particularly ALD (atomic layer deposition), and by electroless plating is high, with the carbon concentration exceeding 100 wt ppm. Such impurities increase resistance, hindering the uniform flow of electricity during copper electroplating and thus giving rise to irregularities and other undesirable effects.

Patent Document 1: Japanese Patent Application Laid-open No. 2008-223100

DISCLOSURE OF THE INVENTION

Problems that the Invention is to Solve

In order to overcome the above-mentioned problems, it is an object of the present invention to provide a seed layer which can be formed with a uniform thickness, and particularly on the inner sidewalls of vias and trenches, can be formed so as to have a sufficient coverage and a film thickness uniform with that on a surface portion, and which has a low level of impurities. Further objects of the invention are to provide a VLSI micro-interconnect member in which, by utilizing the seed layer to subsequently effect copper electroplating, micro-interconnects have been formed with a uniform film thickness without generating voids; a process for forming the same; and a semiconductor wafer in which such VLSI micro-interconnects have been formed.

Means for Solving the Problems

The inventors have conducted extensive investigations, as a result of which they have discovered that a ruthenium plating layer formed by electroplating on the barrier layer of a ULSI micro-interconnect has a uniform thickness and few impurities. The inventors have also found that by using such a layer itself as a seed layer, the above-described problems can be resolved.

Accordingly, the present invention provides:

[1] A ULSI micro-interconnect member having a substrate and a ULSI micro-interconnect formed on the substrate, wherein the ULSI micro-interconnect includes at least a barrier layer formed on the substrate and a ruthenium electroplating layer formed on the barrier layer.

[2] The ULSI micro-interconnect member according to [1], wherein a copper electroplating layer has been formed on the ruthenium electroplating layer, using the ruthenium electroplating layer as a seed layer.

[3] The ULSI micro-interconnect member according to [1] or [2], wherein the barrier layer of the ULSI micro-interconnect is composed of one or more metal elements selected from the group consisting of tungsten, molybdenum and niobium.

[4] The ULSI micro-interconnect member according to any one of [1] to [3], wherein the ruthenium electroplating layer contains as an impurity not more than 100 wt ppm of carbon.

[5] The ULSI micro-interconnect member according to any one of [1] to [4], wherein the substrate is a silicon substrate.

[6] The ULSI micro-interconnect member according to any one of [1] to [5], wherein the ULSI micro-interconnect is a damascene copper micro-interconnect.

[7] A process for fabricating a ULSI micro-interconnect, which comprises at least forming a barrier layer on a substrate and forming a ruthenium electroplating layer on the barrier layer.

[8] The process for fabricating a ULSI micro-interconnect according to [7] which further includes forming a copper electroplating layer on the ruthenium electroplating layer, using the ruthenium electroplating layer as a seed layer.

[9] The process for fabricating a ULSI micro-interconnect according to [7] or [8], wherein the barrier layer of the ULSI micro-interconnect is composed of one or more metal elements selected from the group consisting of tungsten, molybdenum and niobium.

[10] The process for fabricating a ULSI micro-interconnect according to any one of [7] to [9], wherein the ruthenium electroplating layer contains as an impurity not more than 100 wt ppm of carbon.

[11] The process for fabricating a ULSI micro-interconnect according to any one of [7] to [10], wherein the substrate is a silicon substrate.

[12] The process for fabricating a ULSI micro-interconnect according to any one of [7] to [11], wherein the ULSI micro-interconnect is a damascene copper interconnect.

[13] A semiconductor wafer having ULSI micro-interconnects formed by the method according to any one of [7] to [12].

Effects of the Invention

In the ruthenium plating layer of the invention formed on the barrier layer by an electroplating process, inclusion of the impurities is small wherein the carbon content can be controlled to not more than 100 wt ppm, and the film thickness can be made uniform, thus enabling sufficient coverage on the inner sidewalls of vias and trenches in particular and also enabling the film thickness in such places to be made uniform with that at the surface portion. Moreover, in damascene copper interconnects in which such a ruthenium layer has been used as a seed layer, void-free copper micro-interconnects can be formed.

Also, because ruthenium has barrier properties, by providing the ruthenium plating layer, the barrier abilities can be strengthened. Furthermore, because the ruthenium layer is formed by an electroplating process and used as a seed layer, there is no need to form a catalyst layer which is needed in the case of forming a seed layer by electroless plating, thus enabling the film thickness to be correspondingly reduced.

BEST MODE FOR CARRYING OUT THE INVENTION

The barrier layer used in the present invention is preferably composed of one or more metal elements selected from the group consisting of tungsten, molybdenum and niobium, with tungsten being more preferred.

Formation of this barrier layer is not subject to any particular limitation, and may be carried out by a known means such as sputtering, CVD or ALD. However, film formation by sputtering is preferred. The film thickness on the inner sidewalls of vias and trenches is preferably from 1 to 10 nm.

In the practice of the invention, it is important to form on the barrier layer a ruthenium layer by an electroplating process. The ruthenium layer has an excellent thickness uniformity. In damascene interconnects, this ruthenium layer can be formed with sufficient coverage even on the inner sidewalls of vias and trenches in micro-interconnects with a linewidth of 100 nm or less, and has an excellent film thickness uniformity between the surface portion and the inner sidewalls of vias and trenches, the variation therebetween being capable of reduction to less than 20%.

Because the ruthenium layer is formed by an electroplating process, the thickness of the ruthenium layer at trench sidewalls and at the bottom of trenches is substantially the same. Accordingly, with regard to film thickness uniformity, although the film thickness variation between the surface portion and the inner sidewalls of vias and trenches is obtained, the film thicknesses of the ruthenium layer at the surface portion and at the bottom of trenches are uniform and the film thickness variation is also similar.

The film thicknesses of the barrier layer and the ruthenium layer at the surface portion and at the inner sidewalls of vias and trenches can be measured by observing an FIB-processed cross section of the layers through TEM. The variation in the film thickness of the ruthenium layer between the surface portion and the inner sidewalls of vias and trenches is a value determined by dividing the difference between the film thicknesses at the surface portion and the film thickness at the inner sidewalls of vias and trenches by the film thickness at the surface portion. The film thickness at the surface portion and the film thickness on the inner sidewalls of the vias and trenches are average values determined by measuring the film thicknesses at three random points each on the surface portion and on the inner sidewalls of the vias and trenches.

When the ruthenium layer is formed by sputtering instead of electroplating, unlike a ruthenium layer obtained by electroplating, the layer cannot be formed to a uniform thickness. That is, insufficient coverage arises on the inner sidewalls of the vias and trenches, as a result of which the variation in film thickness between the surface portion and the inner sidewalls ends up exceeding 20%, the film thickness overall is non-uniform, or defects such as voids arise during electroplating thereafter.

Also, when an attempt is made to increase the film thickness on the inner sidewalls of vias and trenches, the film thickness at the surface portion becomes very thick, causing necking to occur near the entrances to the vias and trenches, and thus making the entrances narrower. As may be expected, this leads to void formation in subsequent electroplating.

The ruthenium layer obtained by the electroplating process of the invention has a low level of impurities which, in terms of the amount of carbon included, is not more than 100 wt ppm. By contrast, in a ruthenium layer obtained by electroless plating or ALD, the level of impurities is high, with the amount of carbon exceeding 100 wt ppm. As a result, electricity cannot be passed through uniformly during copper electroplating, leading to unevenness of the resulting layer throughout.

In this invention, the amount of carbon in the ruthenium layer was measured with a secondary ion mass spectrometer (SIMS).

Because ruthenium additionally has barrier properties, the ruthenium layer also has the effect of strengthening the barrier properties.

In addition, because the ruthenium layer is formed by electroplating, there is no need to form a catalyst layer needed in the case of forming a seed layer by electroless plating, thus enabling the film thickness to be made correspondingly thinner.

The plating solution and plating conditions used when forming the ruthenium layer by electroplating may be ordinary ruthenium plating solutions and plating conditions that are familiar to the art. For example, the ruthenium plating solution may be one which uses a ruthenium complex salt, one which uses ruthenium chloride, or one which uses ruthenium sulfate. Preferred use may be made of W—Ru·2 (available from Nikko Shoji Co., Ltd.; uses ruthenium sulfate) as the plating solution. Plating is preferably carried out at a current density of from 0.1 to 10 A/dm$^2$ to form a ruthenium layer having a thickness of from 5 to 15 nm on the surface portion and on the inner side walls of vias and trenches.

The substrate used in this invention may be a known substrate and is not subject to any particular limitation, although a silicon substrate is preferred. The substrate may be cleaned and improved in its wettability by subjecting it to acid treatment, alkali treatment, surfactant treatment, ultrasonic cleaning, or treatment involving combinations thereof.

In the present invention, as already mentioned, by additionally providing ULSI copper micro-interconnects on the ruthenium layer formed by electroplating, a ULSI micro-interconnect member may be formed. Because the ruthenium layer is a thin plating film having a uniform film thickness, when this layer is used as a seed layer for damascene copper interconnects, a semiconductor wafer free of defects such as voids and seams can be obtained.

The interconnections are preferably copper or an alloy composed primarily of copper, with copper being more preferred. The copper electroplating solution may have a composition that is commonly used for embedding damascene copper interconnects, and is not subject to any particular limitation. For example, a solution containing copper sulfate and sulfuric acid as the primary ingredients, and containing also, as minor ingredients, chlorine, polyethylene glycol, disodium bis(3-sulfopropyl) disulfide and Janus Green may be used.

EXAMPLES

The invention is illustrated below by way of examples, although these examples are not intended to limit the invention.

With regard to the copper formed as a film in Examples 1 to 3 and Comparative Examples 1 to 4 below, in each case voids formed after embedding copper in the trenches were examined by observing the cross-sections of the trenches through TEM. The barrier properties following vacuum annealing at 400° C. for 30 minutes were examined by AES depth profile measurement.

Example 1

Tungsten was sputtered onto a silicon substrate having trenches with a linewidth of 90 nm and a depth of 300 nm to form a film (film thickness at inner sidewalls of trenches: 5 nm). Ruthenium electroplating was carried out thereon (film thickness at inner sidewalls of trenches: 10 nm), following which copper electroplating for embedding (film thickness at the surface portion: 450 nm) was carried out thereon.

Tungsten sputtering was carried out after 15 minutes of pre-sputtering by generating a plasma at an argon gas pressure of 0.8 Pa and an output power of 50 W.

Using W—Ru·2 (available from Nikko Shoji Co., Ltd.) as a ruthenium electroplating solution, plating was carried out for 17 seconds under the following conditions: ruthenium concentration, 5 g/L; pH, 1.2; bath temperature, 60° C.; current density, 0.2 A/dm$^2$. The copper electroplating solution was composed of 0.25 mol/L of copper sulfate, 1.8 mol/L of sulfuric acid and 1.4 mmol/L of hydrochloric acid, and included also trace amounts of additives (disodium bis(3-sulfopropyl) disulfide, polyethylene glycol, Janus Green). Plating was carried out first for 20 seconds at a bath temperature of 25° C. and a current density of 0.2 A/dm$^2$, then for 120 seconds at 1 A/dm$^2$.

The ruthenium electroplating layer had a film thickness variation between the surface portion and the inner sidewalls of the trenches of 15%, was free of voids, and deposition was uniform. Void generation after the embedding in the trench interiors by the subsequent copper electroplating also was not observed. The barrier properties of the trench inner sidewalls were strengthened by ruthenium film formation, and were entirely acceptable. The carbon content within the ruthenium layer was 30 wt ppm.

Example 2

Molybdenum was sputtered onto a silicon substrate having trenches with a linewidth of 90 nm and a depth of 300 nm to form a film (film thickness at inner sidewalls of trenches: 5 nm). Ruthenium electroplating was carried out thereon (film thickness at inner sidewalls of trenches: 10 nm), following which copper electroplating for embedding (film thickness at the surface portion: 450 nm) was carried out thereon.

Molybdenum sputtering was carried out after 15 minutes of pre-sputtering by generating a plasma at an argon gas pressure of 0.8 Pa and an output power of 50 W.

The compositions of the ruthenium electroplating solution and the copper electroplating solution and the plating conditions were the same as in Example 1.

The ruthenium electroplating layer had a film thickness variation between the surface portion and the inner sidewalls of the trenches of 17%, was free of voids, and deposition was uniform. Void generation after the embedding in the trench interiors by the subsequent copper electroplating also was not observed.

The barrier properties of the trench inner sidewalls were strengthened by ruthenium film formation, and were entirely acceptable. The carbon content within the ruthenium layer was 20 wt ppm.

Example 3

Niobium was sputtered onto a silicon substrate having trenches with a linewidth of 90 nm and a depth of 300 nm to form a film (film thickness at inner sidewalls of trenches: 5 nm). Ruthenium electroplating was carried out thereon (film thickness at inner sidewalls of trenches: 10 nm), in addition to which copper electroplating for embedding (film thickness at the surface portion: 450 nm) was carried out thereon.

Niobium sputtering was carried out after 15 minutes of pre-sputtering by generating a plasma at an argon gas pressure of 0.8 Pa and an output power of 50 W.

The compositions of the ruthenium electroplating solution and the copper electroplating solution and the plating conditions were the same as in Example 1.

The ruthenium electroplating layer had a film thickness variation between the surface portion and the inner sidewalls of the trenches of 18%, was free of voids, and deposition was uniform. Void generation after the embedding in the trench interiors by the subsequent copper electroplating also was not observed.

The barrier properties of the trench inner sidewalls were strengthened by ruthenium film formation, and were entirely acceptable. The carbon content within the ruthenium layer was 25 wt ppm.

Comparative Example 1

Tungsten was sputtered onto a silicon substrate having trenches with a linewidth of 90 nm and a depth of 300 nm to form a film (film thickness at inner sidewalls of trenches: 5 nm), and copper electroplating (film thickness at the surface portion: 450 nm) was carried out directly thereon. Tungsten sputtering was carried out after pre-sputtering for 15 minutes by generating a plasma at an argon gas pressure of 0.8 Pa and an output of 50 W. The copper electroplating solution composition and plating conditions were the same as in Example 1. When copper electroplating was directly carried out without a seed layer, initial copper electroplating deposition was uniform and void generation was not observed even when the trench interior was filled in this manner. However, because the barrier layer on the inner sidewalls of the trenches was composed only of tungsten and was exceedingly thin, sufficient barrier properties were not achieved.

Comparative Example 2

Tungsten was sputtered onto a silicon substrate having trenches with a linewidth of 90 nm and a depth of 300 nm to form a film (film thickness at inner sidewalls of trenches: 5 nm), and then ruthenium was sputtered thereon to form a film (film thickness on inner sidewalls of trenches: 10 nm), onto which copper electroplating for embedding (film thickness at the surface portion of 450 nm) was then directly carried out. Tungsten sputtering and ruthenium sputtering were carried out after pre-sputtering for 15 minutes by generating a plasma at an argon gas pressure of 0.8 Pa and an output of 50 W. The copper electroplating solution composition and plating conditions were the same as in Example 1. When ruthenium sputtering was carried out to a target thickness of 10 nm on the inner sidewalls of the trenches, the film thickness at the surface portion was several tens of nanometers, giving rise to necking near the trench openings and making the openings very narrow. When copper electroplating was carried out in this state, the openings become obstructed before the trench interiors were filled, resulting in void formation.

Comparative Example 3

Tungsten was sputtered onto a silicon substrate having trenches with a linewidth of 90 nm and a depth of 300 nm to form a film (film thickness at inner sidewalls of trenches: 5 nm), a film of ruthenium was formed thereon by ALD (film thickness at inner sidewalls of trenches: 10 nm), then copper electroplating for embedding (film thickness at the surface portion: 450 nm) was carried out thereon. Tungsten sputtering was carried out after pre-sputtering for 15 minutes by generating a plasma at an argon gas pressure of 0.8 Pa and an output of 50 W. Ruthenium ethylcyclopentadienyl and ammonia gas were used as the materials for ruthenium ALD, and plasma ALD film formation was carried out. The copper electroplating solution composition and plating conditions were the same as in Example 1. Because the ruthenium ALD film had a high impurity concentration and the carbon level in particular was high at 200 wt ppm, the resistance was high. As a result, electricity did not flow uniformly during copper electroplating, thus making plating non-uniform. In addition, voids arose in the trenches.

Comparative Example 4

Tungsten was sputtered onto a silicon substrate having trenches with a linewidth of 90 nm and a depth of 300 nm to form a film (film thickness at inner sidewalls of trenches: 5 nm), ruthenium electroless plating (film thickness at trench inner sidewalls: 10 nm) was carried out thereon, and then copper electroplating for embedding (film thickness at the surface portion: 450 nm) was carried out thereon. Tungsten sputtering was carried out after pre-sputtering for 15 minutes by generating a plasma at an argon gas pressure of 0.8 Pa and an output of 50 W. Ruthenium electroless plating was carried out using a ruthenium-nitrosylammine complex-based plating solution containing hydrazine as a reducing agent. The copper electroplating solution composition and plating conditions were the same as in Example 1. Because the ruthenium electroless plating film had a high impurity concentration and the carbon concentration in particular was high at 150 wt ppm, the resistance was high. As a result, electricity did not flow uniformly during copper electroplating, thus making plating non-uniform. In addition, voids arose in the trenches.

The invention claimed is:

1. A ULSI micro-interconnect member having a substrate and a ULSI micro-interconnect formed on the substrate, wherein the ULSI micro-interconnect includes at least a barrier layer formed on the substrate and a ruthenium electroplating layer formed on the barrier layer, wherein the ruthenium electroplating layer contains as an impurity not more than 100 wt. ppm of carbon.

2. The ULSI micro-interconnect member according to claim 1, wherein a copper electroplating layer has been formed on the ruthenium electroplating layer, using the ruthenium electroplating layer as a seed layer.

3. The ULSI micro-interconnect member according to claim 1, wherein the barrier layer of the ULSI micro-interconnect is composed of one or more metal elements selected from the group consisting of tungsten, molybdenum and niobium.

4. The ULSI micro-interconnect member according to claim 1, wherein the substrate is a silicon substrate.

5. The ULSI micro-interconnect member according to claim 1, wherein the ULSI micro-interconnect is a damascene copper micro-interconnect.

6. A process for fabricating a ULSI micro-interconnect, which comprises at least forming a barrier layer on a substrate and forming a ruthenium electroplating layer on the barrier layer, wherein the ruthenium electroplating layer contains as an impurity not more than 100 wt. ppm of carbon.

7. The process for fabricating a ULSI micro-interconnect according to claim 6 which further includes forming a copper electroplating layer on the ruthenium electroplating layer, using the ruthenium electroplating layer as a seed layer.

8. The process for fabricating a ULSI micro-interconnect according to claim 6, wherein the barrier layer of the ULSI micro-interconnect is composed of one or more metal elements selected from the group consisting of tungsten, molybdenum and niobium.

9. The process for fabricating a ULSI micro-interconnect according to claim 6, wherein the substrate is a silicon substrate.

10. The process for fabricating a ULSI micro-interconnect according to claim 6, wherein the ULSI micro-interconnect is a damascene copper interconnect.

11. A semiconductor wafer having ULSI micro-interconnects formed by the method according to claim 6.

* * * * *